(12) United States Patent  
Gongwer et al.

(10) Patent No.: US 6,941,412 B2
(45) Date of Patent: Sep. 6, 2005

(54) SYMBOL FREQUENCY LEVELING IN A STORAGE SYSTEM

(75) Inventors: Geoffrey S. Gongwer, Los Altos, CA (US); Stephen J. Gross, Cupertino, CA (US)

(73) Assignee: SanDisk Corporation, Sunnyvale, CA (US)

( * ) Notice: Subject to any disclaimer, the term of this patent is extended or adjusted under 35 U.S.C. 154(b) by 324 days.

(21) Appl. No.: 10/230,657

(22) Filed: Aug. 29, 2002

(65) Prior Publication Data

US 2004/0044835 A1 Mar. 4, 2004

(51) Int. Cl.[7] .............................................. G06F 12/00
(52) U.S. Cl. ...................... 711/103; 365/202; 365/227; 341/50; 380/210; 713/320
(58) Field of Search ........................ 341/50; 380/210; 365/210, 202, 190, 227, 185.03, 185.21, 185.22, 185.2, 185.3; 711/103; 713/320

(56) References Cited

U.S. PATENT DOCUMENTS

| | | | | |
|---|---|---|---|---|
| 5,504,760 A | * | 4/1996 | Harari et al. ................ | 714/763 |
| 5,602,987 A | | 2/1997 | Harari et al. .................. | 714/8 |
| 5,873,112 A | * | 2/1999 | Norman ....................... | 711/103 |
| 5,907,855 A | * | 5/1999 | Norman ....................... | 711/103 |
| 6,073,208 A | * | 6/2000 | Norman ....................... | 711/103 |
| 6,218,968 B1 | | 4/2001 | Smeets et al. ................ | 341/65 |
| 6,222,762 B1 | | 4/2001 | Guterman et al. ..... | 365/185.03 |
| 6,252,610 B1 | | 6/2001 | Hussain ....................... | 345/506 |
| 6,266,414 B1 | | 7/2001 | Bradley et al. ............. | 380/240 |
| 6,292,868 B1 | * | 9/2001 | Norman ....................... | 711/103 |

OTHER PUBLICATIONS

International Search Report issued Dec. 12, 2003 in International Appln. No. PCT/US03/27322, 4 pages.

* cited by examiner

*Primary Examiner*—Christian P. Chace
(74) *Attorney, Agent, or Firm*—Parsons Hsue & De Runtz LLP

(57) ABSTRACT

Methods and apparatus for transforming data into a format which may be efficiently stored in a non-volatile memory are disclosed. According to one aspect of the present invention, a method for storing information of a first data format in a memory system includes generating statistics associated with the first data format, and transforming the information from the first data format to a second data format using the statistics. Once the information is transformed into the second data format, the information is stored into a memory. Storing the information in the second data format in the memory includes storing an identifier that identifies a transformation used to transform the information to the second data format. In one embodiment, costs associated with storing the information in the second data format are less than or equal to costs associated with storing the information in the first data format.

39 Claims, 8 Drawing Sheets

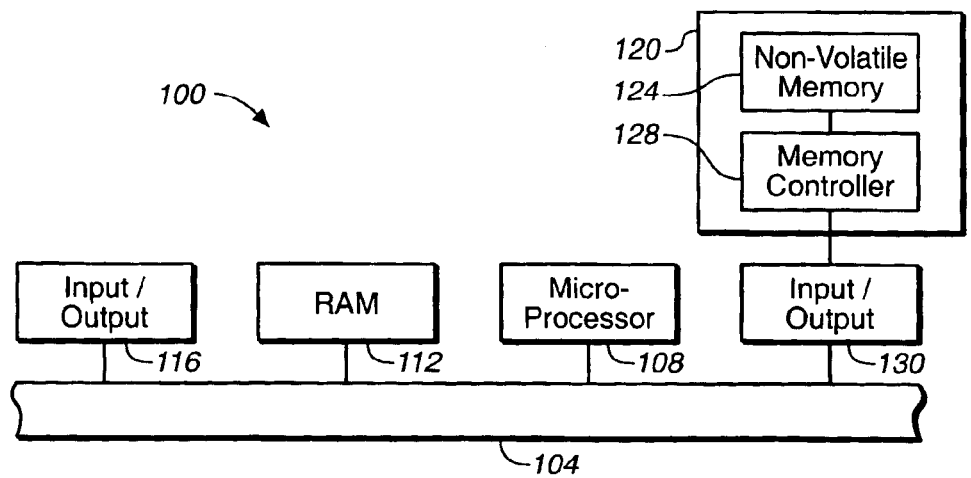
FIG._1a
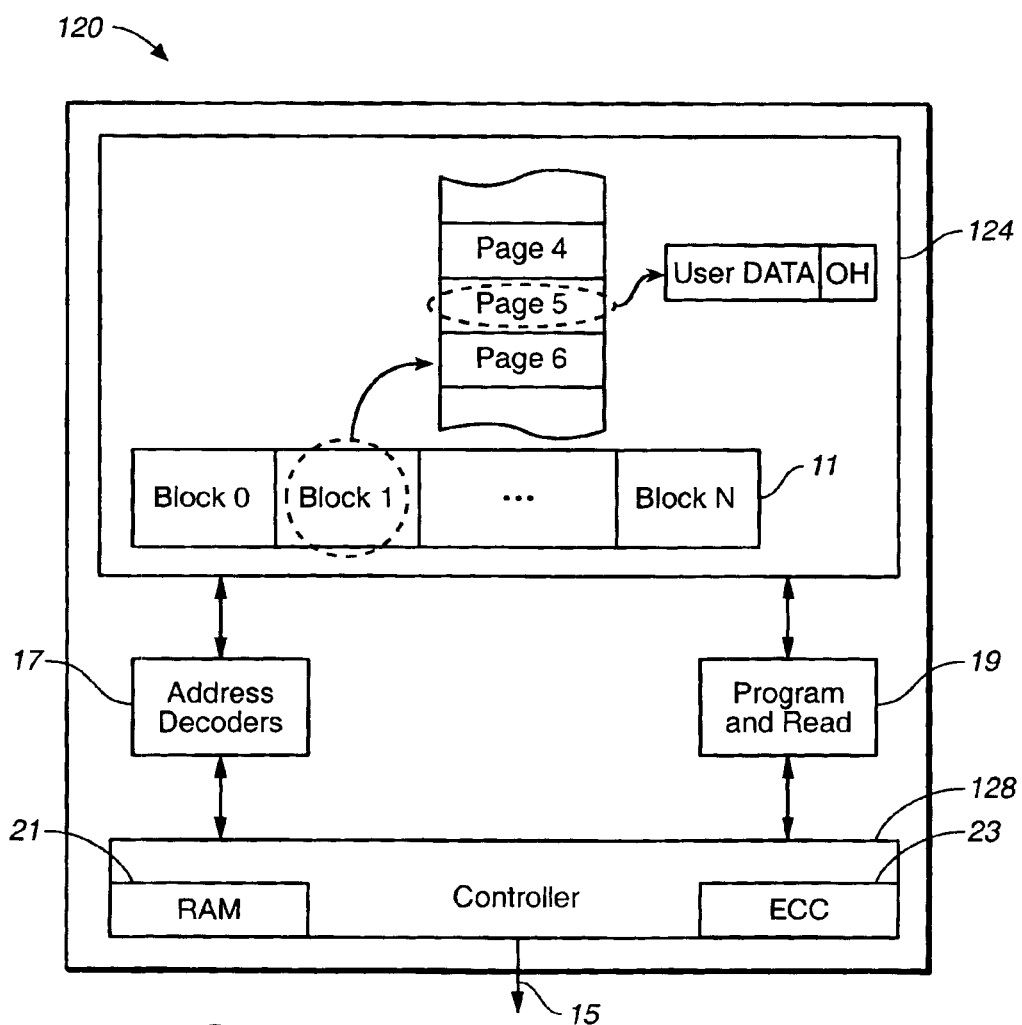
FIG._1b

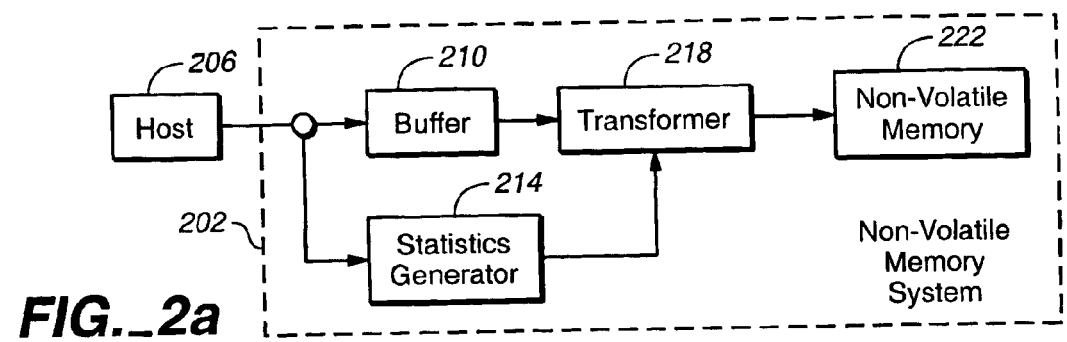
FIG._2a
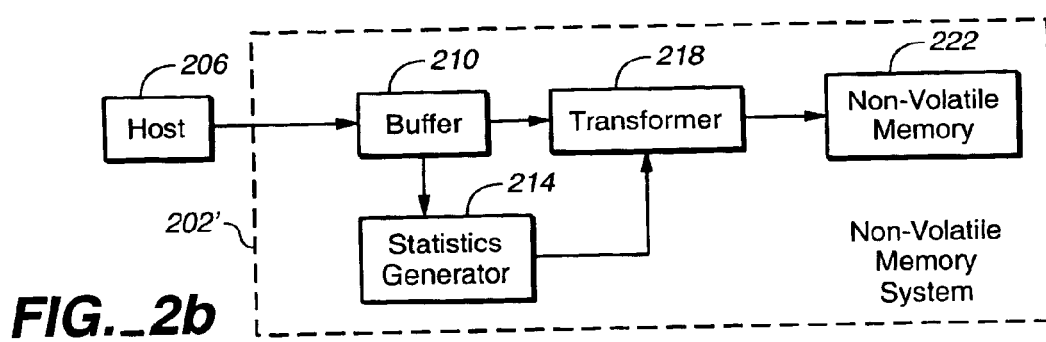
FIG._2b
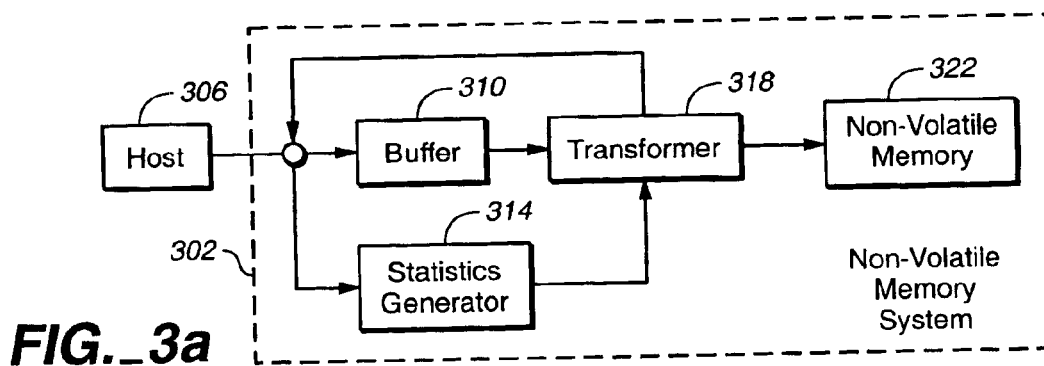
FIG._3a
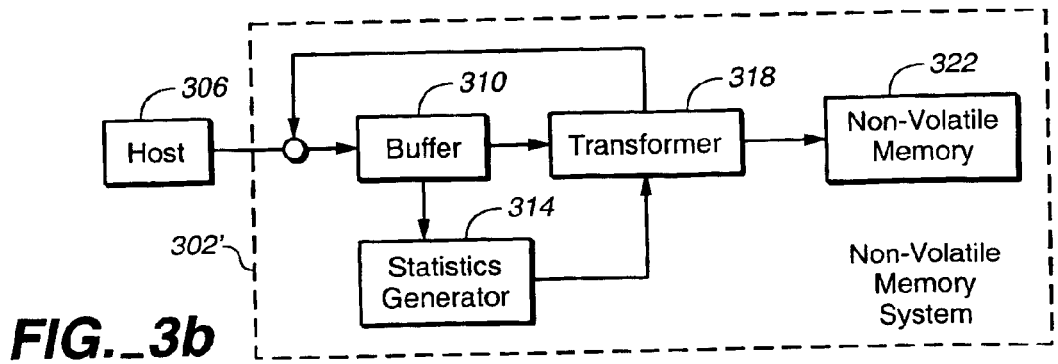
FIG._3b

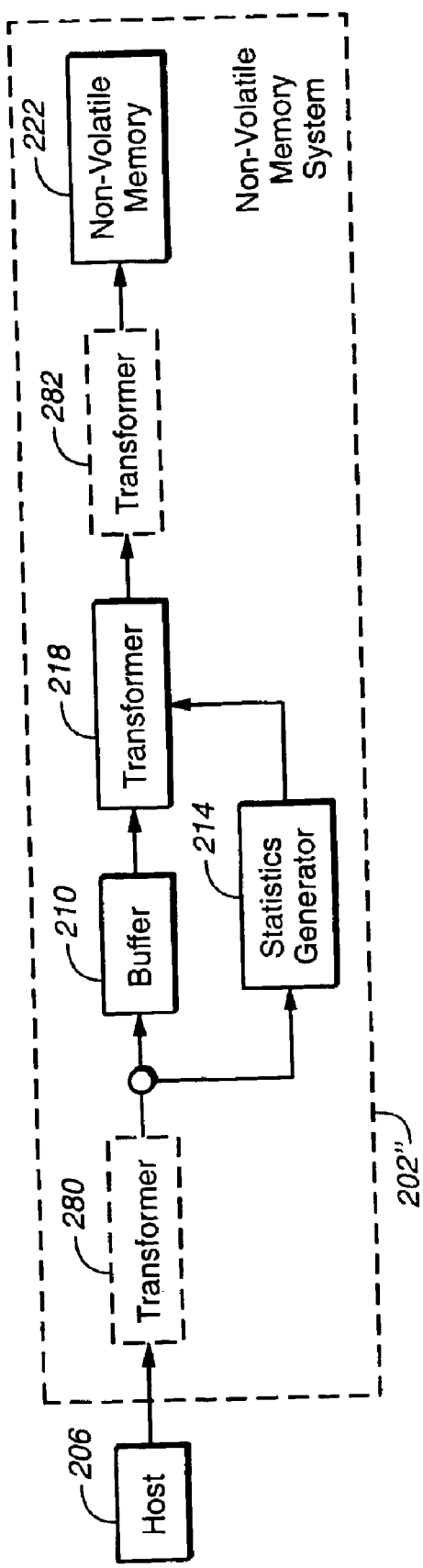
FIG._2c

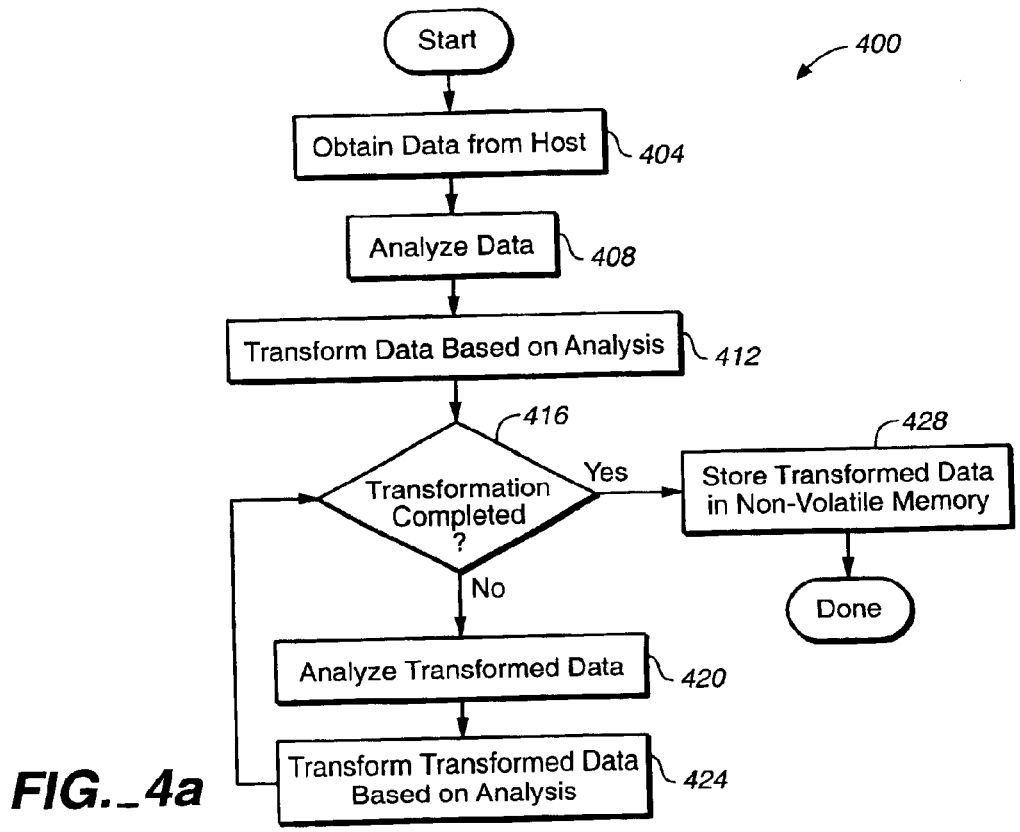
FIG._4a
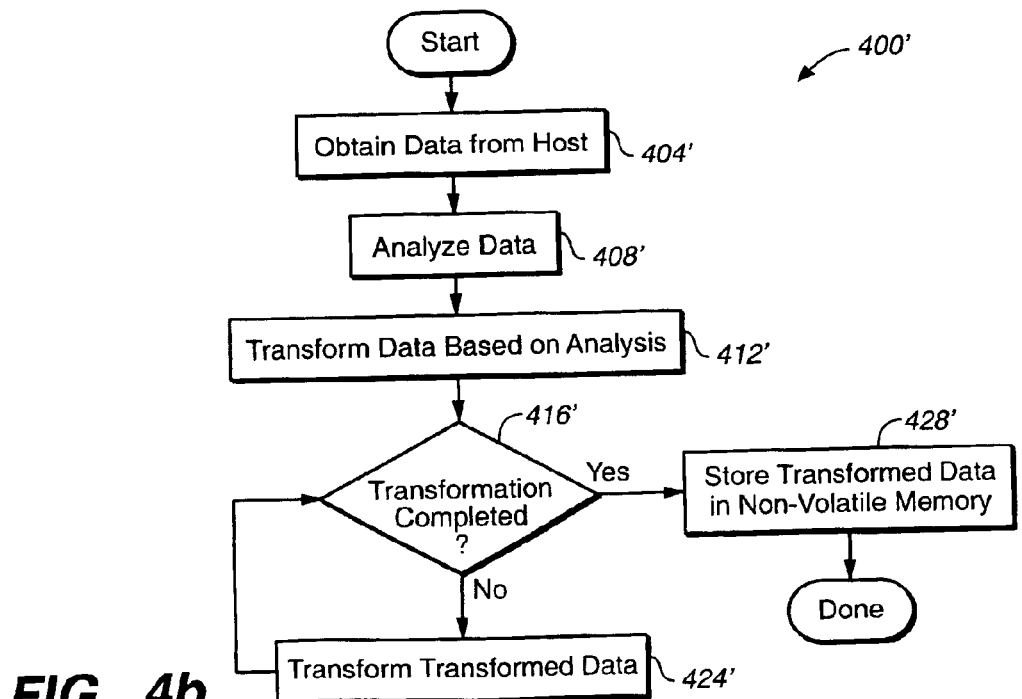
FIG._4b

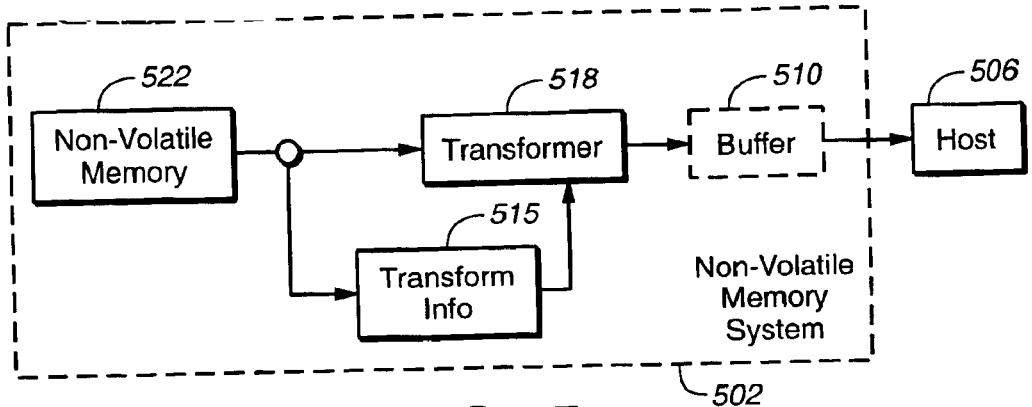
FIG._5
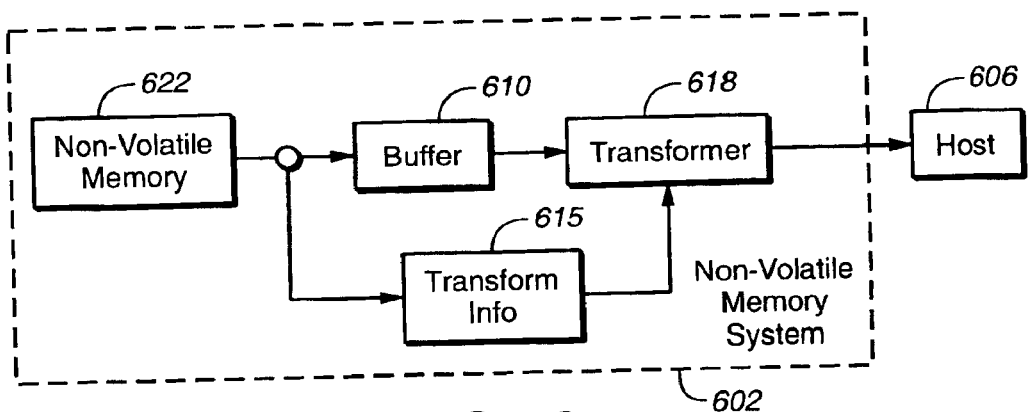
FIG._6
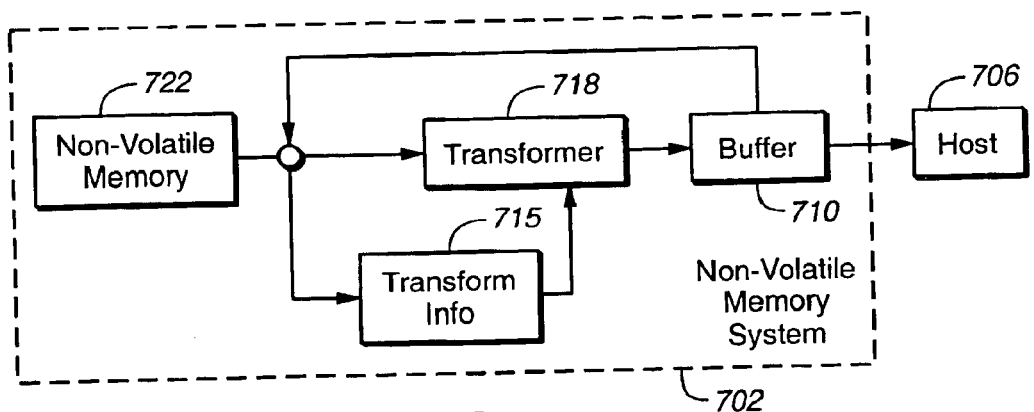
FIG._7

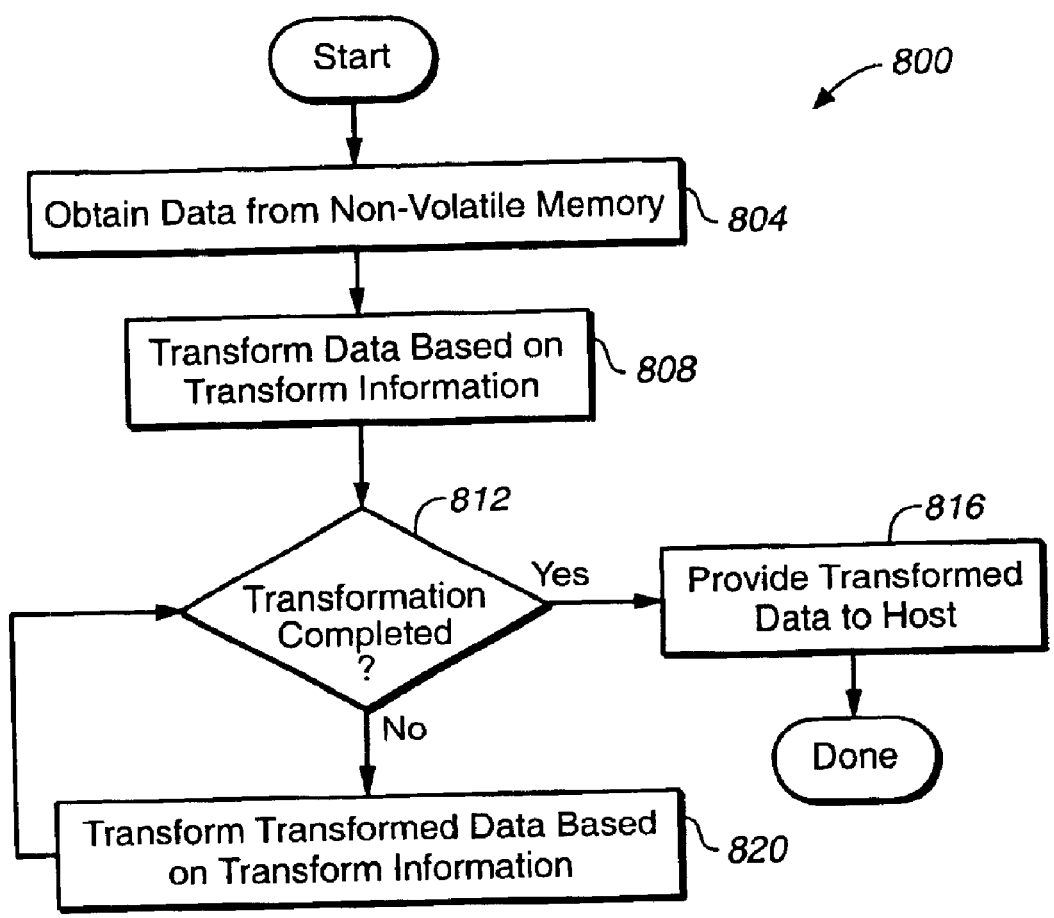
FIG._8

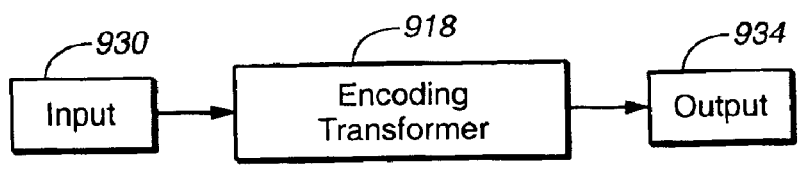
FIG._9a
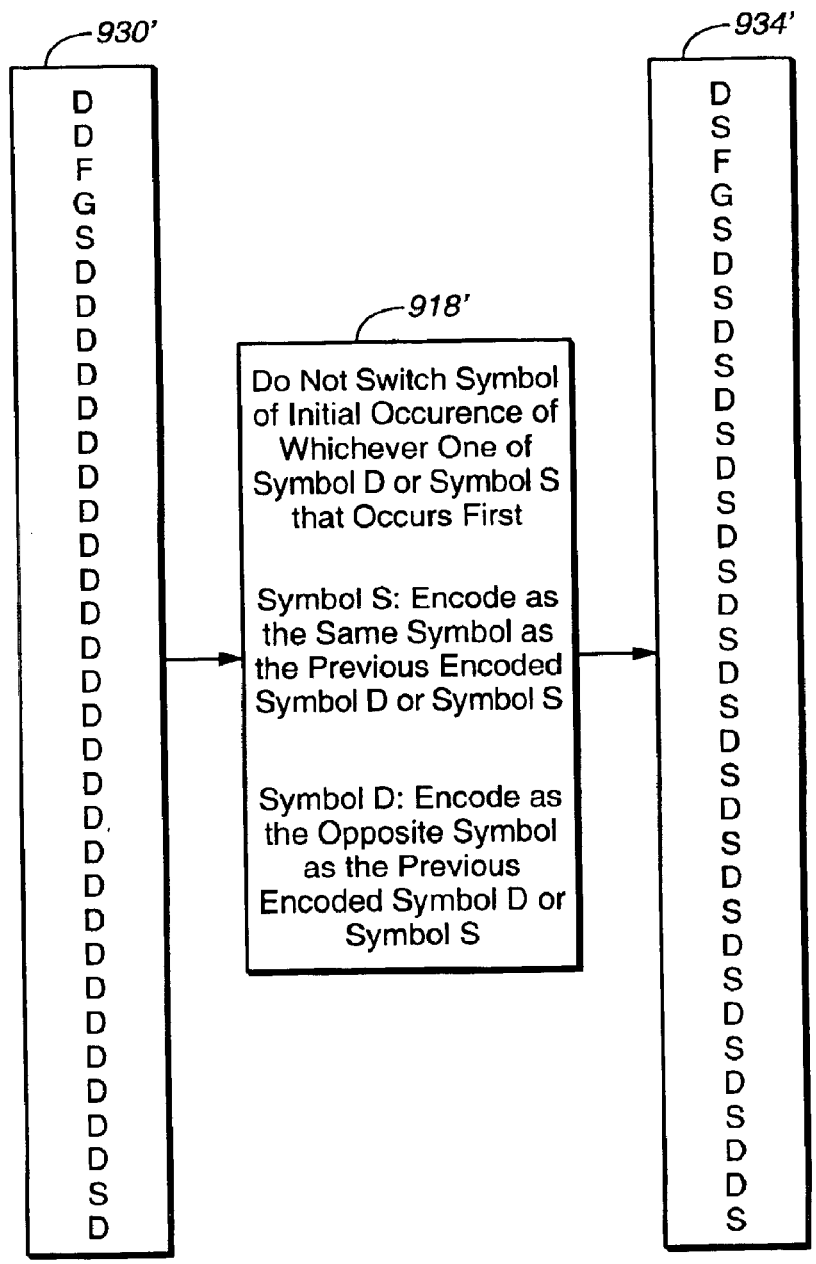
FIG._9b

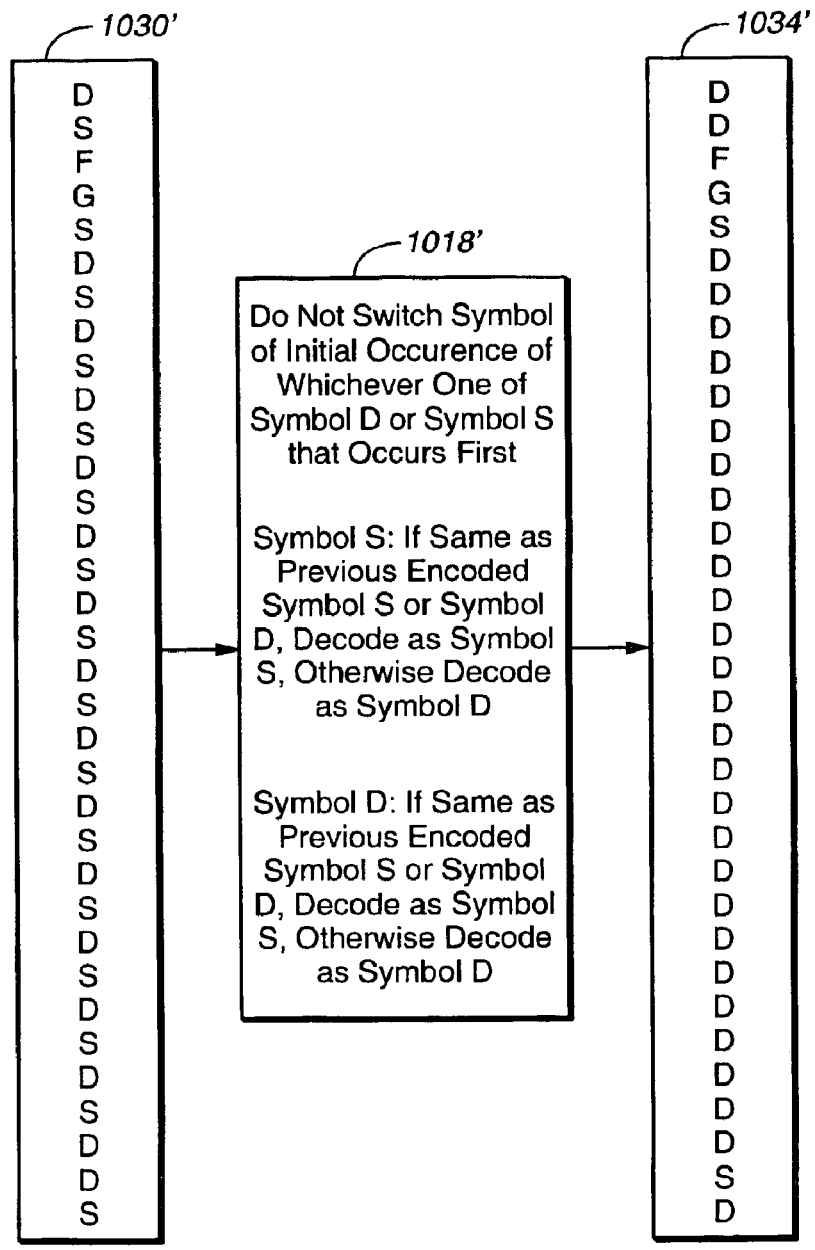
FIG._10a
FIG._10b

SYMBOL FREQUENCY LEVELING IN A STORAGE SYSTEM

BACKGROUND OF THE INVENTION

1. Field of Invention

The present invention relates generally to mass digital data storage systems. More particularly, the present invention relates to systems and methods for automatically performing symbol or state frequency leveling in a storage system such that performance goals are efficiently met when storing substantially any data pattern in a storage system.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

Data sets that are stored in a data block of a non-volatile memory system may have substantially any possible combination of data values. A data block which contains "N" symbols that may each be stored as one of "m" possible values may have "$m^N$" possible data values. By allowing for all possible data values to be stored in a data block, a storage system is typically designed in such a way that it meets performance goals for all possible values, which may not be optimal for the most commonly stored data patterns. That is, in order to ensure that performance requirements may be met for all possible data values or patterns, including less preferred cases or cases which are not likely to occur, the performance associated with the most common, or preferred, data values may be compromised. Allowing for all possible data values to be stored in a data block of a storage system may also lead to relatively complicated design issues, increased reliability issues, a higher power consumption, and a higher cost.

The number of data patterns which may possibly be stored in a data block may be relatively high. Even when substantially only binary states may be stored in a data block, the number of data patterns which may potentially be stored in the data block is substantial. For a data block which may store one hundred binary bits, there are effectively $2^{100}$ data patterns or cases which the data block is arranged to store. The requirements of a storage system which stores the one hundred binary bits is set by, e.g., limited by, a small number of less preferred cases which may require dedicated circuitry to meet minimum performance requirements, or may consume additional power. By way of example, in some systems, storing one hundred binary bits as "1" may be a less preferred case which requires a more expensive storage system than is required by more preferred cases which involve the storage of one hundred binary bits with a mix of "1" and "0" values. Alternatively, a storage system which meets minimum performance requirements when storing less preferred, or rare, cases may compromise the performance level associated with storing more preferred cases. Compromising the performance level associated with storing preferred cases such that minimum performance requirements associated with storing less preferred cases may be met often proves to be inefficient.

In addition to or in lieu of potentially causing a compromise in performance, allowing for all possible data values to be stored in a data block of a storage system often results in higher production costs as the circuitry associated with storing all possible data values may be high. Such circuitry may also require the consumption of a relatively high amount of power. A storage system that stores all possible data values is also likely to be less reliable with respect to both the storage of data and the inclusion of additional circuitry to accommodate the storage of less preferred cases. The need to store all possible data values may also lead to increased development time due to design issues associated with designing circuitry for a storage system that enables all possible data values to be stored which, in turn, may lead to a longer lead time before the storage system is marketable.

Therefore, what is desired is a system which enables less preferred cases to be efficiently stored in non-volatile memory substantially without compromising the performance associated with storing preferred cases. That is, what is needed is a method and an apparatus which effectively enables both less preferred cases and preferred cases to be stored.

SUMMARY OF THE INVENTION

The present invention relates to a system and a method for transforming data into a format which may be efficiently stored in a non-volatile memory. According to one aspect of the present invention, a method for storing information of a first data format in a memory system includes generating statistics associated with the first data format, and transforming the information from the first data format to a second data format using the statistics. Once the information is transformed into the second data format, the information is stored in the second data format into a memory. Storing the information in the second data format in the memory includes storing an identifier in the memory which indicates or identifies a transformation used to transform the information from the first data format to the second data format. Knowledge of the identifier generally allows the information to be transformed from the second data format back into the first data format. In one embodiment, costs associated with storing the information in the second data format are less than or equal to costs associated with storing the information in the first data format.

In another embodiment, the first data format includes at least one occurrence of a first symbol, and generating the statistics associated with the first data format includes determining a density of the first symbol in the first data format. Determining the density may include determining a percentage associated with occurrences of the first symbol in the first data format. In such an embodiment, transforming the information from the first data format to the second data format using the statistics may involve transforming the information from the first data format to the second data format to reduce the density of the first symbol within the information.

Data which is to be stored in a memory system may have many different formats. Some formats, e.g., combinations of logic states or symbols, may be less efficient to store than others, as some formats may allow less preferred cases. Less preferred cases, e.g., cases in which one logic state forms a substantial majority of a set of data, may require dedicated circuitry or have significant power requirements for storage purposes if the storage of less preferred cases is to meet performance requirements. In addition, a memory system which meets performance requirements for the storage of less preferred cases may compromise the performance associated with the storage of more preferred cases, e.g., cases that occur relatively frequently. By converting the format of data before the data are stored, as for example from a less preferred case to a preferred case, the storage of actual less preferred cases may effectively be avoided since a less preferred case will effectively be stored as a preferred case. As a result, the overall storage of data in a memory system may occur more efficiently. Further, costs associated with the memory system may be reduced, and the reliability of memory system may be enhanced.

According to another aspect of the present invention, a method for retrieving information that is stored in a first data format in a memory of a memory system includes analyzing the information in the first data format. Analyzing the information in the first data format includes determining at least one appropriate transformation suitable for transforming the information from the first data format into a second data format. The method also includes transforming the information from the first data format into the second data format using the appropriate transformation. A cost associated with storing the information in the first data format in the memory is no higher than a cost associated with storing the information in the second data format in the memory. In one embodiment, analyzing the information in the first data format includes reading a section of the information in the first data format to identify the appropriate transformation. In another embodiment, the memory system is in communication with a host system, and the method also includes providing the transformed information in the second data format to the host system.

According to still another aspect of the present invention, a system which is capable of transforming and storing data includes a host system and a memory device. The memory device interfaces with the host system to obtain information arranged in a first data format from the host system, and includes a memory, a statistics generator, and a transformer. The statistics generator generates statistics associated with the first data format and the transformer uses the statistics to transform the information from the first data format into a second data format. The transformer also stores the information in the second data format in the memory. The information in the second data format, in one embodiment, is at least as easy to store in the memory as the information in the first data format.

In one embodiment, the transformer stores an identifier as a part of information in the second data format that substantially identifies at least one transformation used to transform the information from the first data format into the second data format. In such an embodiment, the host system may include an information processor and a second transformer. Such an information processor may read the identifier, and cooperate with the second transformer to identify at least one appropriate transformation to transform the information from the second data format to the first data format. It should be understood that the transformer and the second transformer may be separate transformers, transformers that are incorporated into a single transformer, transformers that share some logic, or even separate transformers which have the same logic but are configured to act differently.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which:

FIG. 1a is a diagrammatic representation of a general host system which includes a non-volatile memory device in accordance with an embodiment of the present invention.

FIG. 1b is a diagrammatic representation of a non-volatile memory device, e.g., non-volatile memory device 120 of FIG. 1a, in accordance with an embodiment of the present invention.

FIG. 2a is a diagrammatic representation of a first non-volatile memory system which includes a transformer in accordance with an embodiment of the present invention.

FIG. 2b is a diagrammatic representation of a second non-volatile memory system which includes a transformer in accordance with an embodiment of the present invention.

FIG. 2c is a diagrammatic representation of a third non-volatile memory system which includes a transformer in accordance with an embodiment of the present invention.

FIG. 3a is a diagrammatic representation of a host in communication with a first non-volatile memory system in which multiple transformations on data may be performed before the data are stored in accordance with an embodiment of the present invention.

FIG. 3b is a diagrammatic representation of a host in communication with a second non-volatile memory system in which multiple transformations on data may be performed before the data are stored in accordance with an embodiment of the present invention.

FIG. 4a is a process flow diagram which illustrates the steps associated with one method of efficiently storing data provided by a host into non-volatile memory in accordance with an embodiment of the present invention.

FIG. 4b is a process flow diagram which illustrates the steps associated with another method of efficiently storing data provided by a host into non-volatile memory in accordance with an embodiment of the present invention.

FIG. 5 is a diagrammatic representation of a non-volatile memory system which includes a transformer that decodes encoded data in accordance with an embodiment of the present invention.

FIG. 6 is a diagrammatic representation of a host and a non-volatile memory system which includes a transformer that provides decoded data directly to the host in accordance with an embodiment of the present invention.

FIG. 7 is a diagrammatic representation of a host and a non-volatile memory system which includes a transformer that may use multiple iterations to decode data before the decoded data are provided to the host in accordance with an embodiment of the present invention.

FIG. 8 is a process flow diagram which illustrates the steps associated with decoding encoded data in accordance with an embodiment of the present invention.

FIG. 9a is a diagrammatic representation of a transformer which encodes data in accordance with an embodiment of the present invention.

FIG. 9b is a diagrammatic representation of a transformation associated with encoding transformer 918 of FIG. 9a in accordance with an embodiment of the present invention.

FIG. 10a is a diagrammatic representation of a transformer which decodes data in accordance with an embodiment of the present invention.

FIG. 10b is a diagrammatic representation of a decoding transformer which is suitable for reversing the encoding performed by encoding transformer 918' of FIG. 9b in accordance with an embodiment of the present invention.

DETAILED DESCRIPTION OF THE EMBODIMENTS

By converting the format of data before the data are stored, as for example from a less preferred case to a preferred case, the storage of actual less preferred cases may effectively be avoided since a less preferred case will effectively be stored as a preferred case. As a result, the overall storage of data in a memory system may occur more efficiently, since the storage of less preferred cases will generally not consume more power than the storage of preferred cases, and performance penalties associated with the storage of less preferred cases may be avoided. Further, in a memory system which stores less preferred cases as more preferred cases, the circuitry associated with the storage of data may be less complicated, e.g., take less time to design, and be somewhat easier to produce. That is, overall costs or cost factors associated with at least one of power usage, performance penalties, design issues, and productions issues may be reduced. For example, a cost associated with power consumption may be reduced, performance penalties or costs may be reduced, a cost associated with designing complicated circuitry may be reduced, and productions costs may be reduced.

When data are to be stored on a memory device such as a non-volatile memory device, a host system may provide the data to the non-volatile memory device. In one embodiment, the non-volatile memory device may effectively reduce the data to determine relative densities of logic states and symbols occurring within the data, then select an appropriate transformation based on the relative densities to use to transform the data into an efficiently stored format. A symbol may be a bit or a combination of substantially any number of bits. While a data format that is considered to be efficiently storable may vary widely depending upon the requirements of a particular system, efficiently storable data formats may include formats which include a substantially even distribution of logic states, formats which minimize a maximum density of particular logic states, and formats which maximize a minimum density of particular logic states.

Referring initially to FIG. 1a, a general host system which includes a non-volatile memory device 120, e.g., a CompactFlash memory card, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, or a video player. It should be appreciated, however, that host system 100 may generally be substantially any system which stores data or information, and retrieves data or information.

It should be appreciated that host system 100 may also be a system which either only captures data, or only retrieves data. That is, host system 100 may be a dedicated system which stores data, or host system 100 may be a dedicated system which reads data. By way of example, host system 100 may be a memory writer which is arranged only to write or store data. Alternatively, host system 100 may be a device such as an MP3 player which is typically arranged to read or retrieve data, and not to capture data.

A non-volatile memory device 120 which, in one embodiment, is a removable non-volatile memory device, is arranged to interface with bus 104 to store information. An optional input/output circuit block 130 may allow non-volatile memory device 120 to interface indirectly with bus 104. When present, input/output circuit block 130 serves to reduce loading on bus 104, as will be understood by those skilled in the art. Non-volatile memory device 120 includes non-volatile memory 124 and a memory control system 128. In one embodiment, non-volatile memory device 120 may be implemented on a single chip or a die. Alternatively, non-volatile memory device 120 may be implemented on a multi-chip module, or on multiple discrete components which may be used together as non-volatile memory device 120. One embodiment of non-volatile memory device 120 will be described below in more detail with respect to FIG. 1b.

Non-volatile memory 124 is arranged to store data such that data may be accessed and read as needed. Data stored in non-volatile memory 124 may also be erased as appropriate, although it should be understood that some data in non-volatile memory 124 may not be erasable. The processes of storing data, reading data, and erasing data are generally controlled by memory control system 128. In one embodiment, memory control system 128 manages the operation of non-volatile memory 124 such that the lifetime of non-volatile memory 124 is substantially maximized by essentially causing sections of non-volatile memory 124 to be worn out substantially equally.

Non-volatile memory device 120 has generally been described as including a memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art.

With reference to FIG. 1b, non-volatile memory device 120 will be described in more detail in accordance with an embodiment of the present invention. As described above, non-volatile memory device 120 includes non-volatile memory 124 and memory control system 128. Memory 124 and control system 128, or controller, are primary components of non-volatile memory device 120. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

Control system 128 communicates over a bus 15 to a host computer or other system that is using the memory system to store data. Bus 15 is generally a part of bus 104 of FIG. 1a. Control system 128 also controls operation of memory 124, which may include a memory cell array 11, to write data provided by the host, read data requested by the host and perform various housekeeping functions in operating memory 124. Control system 128 generally includes a general purpose microprocessor which has associated software memory and various logic circuits. One or more state machines are often also included for controlling the performance of specific routines.

Memory cell array 11 is typically addressed by control system 128 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

Array 11 is divided into a large number of BLOCKS 0-N of memory cells. As is common for flash EEPROM systems, the block is the unit of erase. That is, each block contains the minimum number of memory cells that are erased together. Each block is typically divided into a number of pages, as also illustrated in FIG. 1b. A page is the unit of programming. That is, a basic programming operation writes data into a minimum of one page of cells. One or more sectors of data are typically stored within each page. As shown in FIG. 1b, one sector includes user data and overhead data. Overhead data typically includes an error correction code (ECC) that has been calculated from the user data of the sector. A portion 23 of the control system 128 calculates the ECC when data is being programmed into array 11, and also checks the ECC when data is being read from array 11. Alternatively, the ECCs are stored in different pages, or different blocks, than the user data to which they pertain.

A sector of user data is typically 512 bytes, corresponding to the size of a sector in magnetic disk drives. Overhead data is typically an additional 28 bytes. One sector of data is most commonly included in each page but two or more sectors may instead form a page. A large number of pages form a block, anywhere from 8 pages, for example, up to 512, 1024 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

Data that is provided through bus 104 of FIG. 1a to non-volatile memory device 120 for storage in non-volatile memory 124, e.g., cells in non-volatile memory 124, may generally include preferred cases and less preferred cases. The preferred cases may include data patterns which either occur relatively frequently or data patterns which include densities of symbols, e.g., states, that are considered to be relatively easy to store or retrieve, e.g., require relatively little overhead or power. On the other hand, less preferred cases may include data patterns that either occur relatively infrequently or data patterns which include densities of symbols that are considered to be relatively difficult to store or retrieve. In the described embodiment, preferred cases are typically data patterns which are relatively easy or efficient to store in or retrieve from non-volatile memory 124, while less preferred cases are typically data patterns which are relatively difficult or inefficient to store in or retrieve from non-volatile memory 124.

Transforming data before the data are stored in non-volatile memory 124 such that less preferred cases may effectively be avoided, i.e., such that less preferred cases are transformed or encoded as more preferred cases, allows data to be efficiently stored. Transforming, or manipulating, data such that substantially all data patterns may be stored in non-volatile memory 124 as relatively preferred cases enables storage operations to occur relatively inexpensively.

Transforming data dynamically enables a data pattern which may be a less preferred case to be transformed into a more preferred case before storing the data. In addition to storing the transformed data in non-volatile memory 124, additional data may be stored which indicates both that a transformation was performed on the data, and which type of transformation was performed. Such information may be used when the data are retrieved from non-volatile memory 124 to retransform the data into an original state. That is, when data are transformed and stored, information relating to the transformation is also stored in order to enable the transformation to be reversed when the transformed data are received to effectively return the data to their original states. In one embodiment, the information relating to the transformation is stored as five bits, although the number of bits may be widely varied. Generally, the information relating to the transformation may be prepended to, appended to, incorporated into, or interspersed within the transformed data. It should be understood, however, that the data may also be stored separately from the transformed data.

A transformation may be performed to ensure that no data pattern has more than a certain percentage of a first symbol, or no less than a certain percentage of a second symbol. For example, the maximum density of any particular symbol may be minimized, or the minimum density of any particular symbol may be maximized. In some embodiments, transformations may occur to effectively ensure that certain minimum and certain maximum percentages of different symbols are met by a transformed data pattern. By ensuring that certain percentages of symbols are achieved, e.g., that maximum densities of each symbol are minimized, less preferred cases may generally be avoided. As will be appreciated by those skilled in the art, symbols may be associated with the representation of different states.

Generally, data may be transformed before being stored in a data block within a non-volatile memory system. While a data transformation may occur on a host before data are provided to a non-volatile memory system, a data transformation typically occurs within the non-volatile memory system. In one embodiment, the data transformation occurs after data are read from the host into a buffer associated with the non-volatile memory system, but before the data are stored in a data block. With reference to FIG. 2a, one embodiment of a non-volatile memory system which includes a transformer will be described in accordance with the present invention. A non-volatile memory system 202 is in communication with a host 206 such that host 206 may provide data values to system 202. Host 206 provides data, e.g., "raw" or untransformed data, to a buffer 210 and to a statistics generator 214. In one embodiment, a non-volatile memory system 202' may be in communication with a host 206 that provides untransformed data to buffer 210, and not to statistics generator 214, as shown in FIG. 2b. In such an embodiment, i.e., the embodiment shown in FIG. 2b, buffer 210 may be arranged to provide the untransformed data to statistics generator 214.

Referring back to FIG. 2a, while buffer 210 is arranged to temporarily store data before the data are transformed by transformer 218, statistics generator 214 analyzes or otherwise reduces the data to generate statistics which are used to determine a transformation to be used by transformer 218. In one embodiment, statistics generator 214 is arranged to determine how many of each symbol appears in the data. Statistics generator 214 may also be arranged to determine an overall percentage of occurrence of each symbol with respect to an entire data stream.

Statistics generated by statistics generator 214 are used by transformer 218 to encode the data as a preferred data pattern. In general, transformer 218 also stores the encoded data in a non-volatile memory 222 which may include memory cells or memory blocks. As will be appreciated by those skilled in the art, transformer 218, which uses statistics generated by statistics generator 214, may be only one of a plurality of transformers associated with non-volatile memory system 202. By way of example, as will be described below with respect to FIG. 2c, additional transformations may occur either before or after the transformation performed by transformer 218.

Transformer 218 may also add bits to the encoded data which are arranged to indicate how the encoded data are to be decoded, or retransformed, e.g., when the encoded data are obtained from non-volatile memory 222, as previously mentioned. In one embodiment, rather than incorporating bits in the encoded data to indicate how the encoded data are to be decoded, an identifier may be separately stored, as for example in a look-up table associated with a different section of non-volatile memory 222 than the section in which the encoded data are stored. Such an identifier may then be accessed when storage information is needed, or when encoded data are to be decoded.

It should be appreciated that when the data are already in the form of either a preferred or desirable data pattern, transformer 218 may choose not to encode the data. In other words, not all data that passes through transformer 218 is transformed. When a data pattern is not transformed by transformer 218, transformer 218 also may not append, prepend, incorporate, or intersperse any symbols or bits to the data pattern prior to storing the data in non-volatile memory 222, as there is essentially no need for bits which indicate how the data pattern is to be retransformed. Alternatively, transformer 218 may append, prepend, incorporate, or intersperse bits to a data pattern which indicate that the data pattern has been processed by transformer 218 but has not been transformed.

Once data are processed by transformer 218, processed data are typically stored into non-volatile memory 222. As will be discussed in more detail below, in one embodiment, encoded data that passes through transformer 218 may be read into buffer 210 such that at least one other transformation may be performed by transformer 218 on the transformed data to further transform the symbol densities, e.g., state densities, before a storage operation is performed. Transformations may include leveling processes which may be arranged to reduce the frequency of occurrence of one or more symbols in a data pattern or to increase the frequency of occurrence of one or more symbols in the data pattern. Leveling processes may also be arranged to both reduce the frequency of occurrence of one or more symbols in a data pattern and increase the frequency of occurrence of one or more symbols in the data pattern.

As previously mentioned, a non-volatile memory system may have more than one associated transformer. FIG. 2c is a diagrammatic representation of a host in communication with a non-volatile memory system which includes a plurality of transformers in accordance with an embodiment of the present invention. A non-volatile memory system 202" is in communication with a host 206 such that host 206 may provide data values to system 202". Host 206 may provide data, e.g., "raw" or untransformed data, to an optional first transformer 280 which may transform the data using substantially any suitable transformation algorithm. Suitable transformation algorithms may include, but are not limited to, a predetermined transformation algorithm, a transformation based on using a random number generator to identify a suitable transform, or a rotational transformation algorithm. Data processed by optional first transformer 280 may then be provided to buffer 210 and to a statistics generator 214.

Buffer 210 is arranged to temporarily store data before the data are transformed by transformer 218. Statistics generator 214 analyzes or otherwise reduces the data to generate statistics which are used to determine a transformation to be used by transformer 218. In one embodiment, statistics generator 214 is arranged to determine how many of each symbol appears in the data, i.e., the data processed by optional first transformer 280. Statistics generator 214 may also be arranged to determine an overall percentage of occurrence of each symbol with respect to an entire data stream.

Transformer 218 uses statistics generated by statistics generator 214 to encode the data as a preferred data pattern. In the described embodiment, transformer 218 may also provide the encoded data to a second optional transformer 282 which may transform the encoded data using substantially any transformation that is not based on the statistics generated by statistics generator 214. That is, transformer 218 may provide encoded data to second optional transformer 282 which may further transform the encoded data using a conventional transformation method. Second optional transformer 282 may store transformed data in a non-volatile memory 222 which may include memory cells or memory blocks. It should be appreciated that either or both first optional transformer 280 and second optional transformer 282 may be included in non-volatile memory system 202".

FIG. 3a is a diagrammatic representation of a host in communication with a non-volatile memory system in which multiple transformations on data may be performed before the data are stored in accordance with an embodiment of the present invention. Like non-volatile memory system 202 of FIG. 2a, a non-volatile memory system 302 includes a buffer 310, a transformer 318, a statistics generator 314, and a non-volatile memory 322. Non-volatile memory 322 generally includes blocks or cells in which data may be stored. System 302 is in communication with a host 306, or a source, such that host 306 may provide data values or information into system 302.

Host 306 provides data in the form of symbols to buffer 310 as well as to statistics generator 314. Although host 306 provides data to statistics generator 314, in one embodiment, buffer 310 may instead provide the data to statistics generator 314, as shown in non-volatile memory system 302' of FIG. 3b. Returning to FIG. 3a, buffer 310 is arranged to temporarily store data, e.g., buffer 310 may serve as a staging area for data, before the data are transformed by transformer 318. Statistics generator 314 generates statistical information from the data that is effectively used to identify an appropriate transformation to be used by transformer 318 to process data. As will be understood by those skilled in the art, while the statistical information that is generated may be substantially any suitable information, statistics which identify densities of certain symbols or states in a data pattern may be particularly useful.

Statistics generated by statistics generator 314 from data may be used by transformer 318 to encode the data as a preferred data pattern. In some cases, a preferred data pattern which may be efficiently stored into non-volatile memory 322 may be achieved using multiple transformations, even though the preferred data pattern is achievable in a single transformation. Multiple transformations may be preferable over a single transformation, for example, due to any combination of circuitry considerations, power considerations, design considerations, a speed considerations. Accordingly, transformed data may be provided by transformer 318 to buffer 310 and statistics generator 314. Statistics generator 314 may then generate statistics based upon the transformed data that may be used by transformer 318 to further transform the data. When data processed by transformer 318 is finally encoded such that the associated data pattern is a preferred case, then the data are stored into non-volatile memory 322, along with bits which identify the transformations which were used to create the data pattern that is stored in non-volatile memory 322. In one embodiment, information which includes substantially all necessary information needed to fully decode transformed data may be stored in non-volatile memory 322 during an initial transformation, e.g., information associated with all transformations may be stored substantially only when the initial transformation occurs.

FIG. 4a is a process flow diagram which illustrates the steps associated with efficiently storing data provided by a host into non-volatile memory in accordance with an embodiment of the present invention. A process 400 of storing data begins at step 404 in which data are obtained from a host, e.g., by a non-volatile memory system such as either non-volatile memory system 202 of FIG. 2a or non-volatile memory system 302 of FIG. 3a. Once data are obtained from the host, the data are analyzed in step 408. Analyzing the data obtained from the host may include, but is not limited to, generating statistics regarding the percentage or density of occurrences of particular symbols or states in the data.

After data are analyzed in step 408, the data are transformed in step 412. In the described embodiment, the data are effectively transformed based upon the analysis performed in step 408. By way of example, if the analysis determined that certain symbols or states in the data occur with a higher density or frequency than desired, the results of the analysis may be used such that the selected transformation is arranged to reduce the density of those symbols or states. It should be understood that when the data are already in the format of a preferred case, data may not necessarily be transformed.

In general, when data are transformed in step 412, a new data pattern is generated. To enable the new data pattern to be decoded or otherwise "untransformed" such that the original data pattern obtained from the host may effectively be recreated, a series of bits may be prepended to, appended to, or incorporated into the new data pattern. Such a series of bits may be arranged to specify the transformation that was used to encode the original data pattern or, alternatively, to specify an appropriate reverse transformation that may be used to decode the new data pattern into the original data pattern.

A determination is made in step 416 regarding whether the transformation of data is completed. That is, it is determined if the transformation performed in step 412 was effective to create a data pattern which may be efficiently stored. If the determination is that the transformation is not completed, then the indication is typically that at least one symbol or state in the transformed data pattern either occurs too frequently or not frequently enough. As such, the transformed data pattern may be transformed at least one other time. Accordingly, process flow proceeds from step 416 to step 420 in which the transformed data are analyzed such that statistics relating to the transformed data may be generated. Then, in step 424, the transformed data are transformed based upon the results of the analysis. After the transformed data are transformed in step 424, process flow returns to step 416 in which it is determined if the transformation has been completed.

If the determination in step 416 is that data has been successfully transformed into a preferred case, then the indication is that no additional transformations are to be performed on the data. Hence, in step 428, the transformed data are stored in non-volatile memory, and the process of efficiently storing data is completed.

Another suitable method for storing data provided by a host into non-volatile memory is shown in FIG. 4b. FIG. 4b is a process flow diagram which illustrates the steps associated with another method of efficiently storing data provided by a host into non-volatile memory in accordance with an embodiment of the present invention. A process 400' of storing data begins at step 404' in which data are obtained from a host. Once data are obtained from the host, the data are analyzed in step 408'. Analyzing the data obtained from the host may include, as previously mentioned, generating statistics regarding the percentage or density of occurrences of particular symbols or states in the data.

After data are analyzed in step 408', the data are transformed in step 412', as for example using results of the analysis performed in step 408'. When data are transformed in step 412', a new data pattern is typically generated. In order to enable the new data pattern to be decoded or otherwise "untransformed" such that the original data pattern obtained from the host may effectively be recreated, a series of bits may be incorporated into, e.g., appended to, the new data pattern. Such an appended series of bits may be arranged to specify the transformation that was used to encode the original data pattern or, alternatively, to specify an appropriate reverse transformation that may be used to decode the new data pattern into the original data pattern.

It is determined in step 416' whether the transformation performed in step 412' was effective to create a data pattern which may be efficiently stored. If the determination is that the transformation is not completed, then the indication is typically that at least one symbol or state in the transformed data pattern either occurs too frequently or not frequently enough. As such, the transformed data pattern may be transformed at least one other time. Accordingly, process flow proceeds from step 416' to step 424', in which the transformed data are transformed. After the transformed data are transformed in step 424', process flow returns to step 416' in which it is determined if the transformation has been completed. If the determination in step 416' is that data has been successfully transformed into a preferred case, then the indication is that no additional transformations are to be performed on the data. Hence, in step 428', the transformed data are stored in non-volatile memory, and the process of efficiently storing data is completed.

Data that is encoded as a relatively preferred case, then stored in non-volatile memory, may be efficiently stored. For example, the time associated with storing the data is relatively low and the power consumed to store the data is relatively low. More specifically, the time associated with storing the encoded data and the power requirements for storing the encoded data may remain consistent for substantially all cases of encoded data which are stored, as even less preferred cases may be transformed into relatively preferred cases. Further, as less preferred cases are effectively no longer stored, i.e., less preferred cases are stored as data that has been transformed into a preferred case, and substantially no circuitry that is effectively required for the storage of less preferred cases is needed.

When encoded data are to be obtained from a non-volatile memory upon a command from a host, the encoded data are generally decoded before being provided to the host. Such decoding typically occurs within the non-volatile memory system associated with the non-volatile memory. With reference to FIG. 5, one embodiment of a non-volatile memory system which includes a transformer that decodes encoded data will be described in accordance with the present invention. A host 506 is in communication with a non-volatile memory system 502 such that data or information may be exchanged between host 506 and system 502. When host 506 attempts to retrieve data from a non-volatile memory 522 associated with system 502, data that has been processed by a transformer, e.g., encoded by transformer 318 of FIG. 3, is read into transformer 518 and provided to a transformation information processor 515.

Transformation information processor 515 generally reads information from processed data to determine an appropriate transformation to be performed by transformer 518 to decode the processed data. As described above, when transformed data are stored, the transformed data are stored with information that indicates which transformation was used to transform the data or, alternatively, which reverse transformation may be used to reverse the transformation that was used to transform the data. Hence, transformation information processor 515 studies the information stored with the encoded data, e.g., prepended onto a processed data pattern, and effectively identifies an appropriate reverse transformation for transformer 518 to use to decode the encoded data. As the encoded data are decoded, e.g., as the encoded data are returned to an original state, then the decoded data are provided to a buffer 510 of system 502. Buffer 510 then provides the decoded data to host 506.

In one embodiment, as for example an embodiment in which information which identifies an appropriate reverse transformation is prepended to the processed data pattern, then buffer 510 may be substantially eliminated. When information which identifies an appropriate reverse transformation is prepended to the processed data pattern, then the appropriate reverse transformation is effectively known before the processed data pattern is read into transformer 518. As a result, since information that identifies an appropriate reverse transformation is prepended to processed data, transformer 518 will effectively be aware of how to perform a reverse transformation before the processed data are read. Hence, the need to first buffer the processed data before providing the processed data to transformer 518 is effectively eliminated because the appropriate reverse transformation may be identified from the prepended information before the processed data are read out of non-volatile memory 522.

In another embodiment, a transformer may provide decoded data directly to a host. FIG. 6 is a diagrammatic representation of a host and a non-volatile memory system which includes a transformer that provides decoded data directly to the host in accordance with an embodiment of the present invention. When a host 606 requests information from a non-volatile memory system 602, a non-volatile memory 622 of system 602 provides processed, e.g., encoded, data to a buffer 610 and a transform information processor 615 of system 602. Transform information processor 615 reads symbols associated with the processed data received from non-volatile memory 622 which indicate either which transformation was used to process the processed data, or which reverse transformation is appropriate to return the processed data to its original, or decoded, format.

Transform information processor 615 provides information to transformer 618 such that transformer 618, which receives processed data from non-volatile memory 622 via buffer 610, may reverse any transformation associated with the processed data. That is, transformer 618, using information provided by transform information processor 615, decodes encoded data which was stored in non-volatile memory 622. Once transformer 618 decodes the encoded data, the decoded data are provided to host 606.

As mentioned above with respect to FIG. 3, in order to meet storage requirements associated with a non-volatile memory, multiple transformations may be performed on data such that the data may be encoded as a preferred case. That is, it may take more than one transformation to transform data into what may be considered to be an acceptable format, e.g., to effectively ensure that less than a maximum allowable percentage of storage elements or cells associated with the data are in any single logic state. When data are transformed using multiple transformations, then multiple reverse transformations are generally used to decode transformed data, or otherwise return the transformed data to their original, i.e., untransformed, format.

FIG. 7 is a diagrammatic representation of a host and a non-volatile memory system which includes a transformer that may use multiple iterations to decode data before the decoded data are provided to the host in accordance with an embodiment of the present invention. In response to a request from a host 706 for information stored in a non-volatile memory system 702, a non-volatile memory 722 of system 702 provides data, e.g., encoded data, to a transformer 718 and a transform information processor 715 of system 702. Transform information processor 715 reads bits associated with the encoded data received from non-volatile memory 722 which indicate either which transformations were used to process the encoded data, or which reverse transformations are appropriate to return the encoded data to its original, or decoded, format. In the described embodiment, the symbols which indicate associated transformation or reverse transformations may also include information which indicates an order in which the transformations were performed or, alternatively, an order in which the reverse transformations are to be performed. Further, the symbols may include information relating to a number of transformations which were performed.

Transform information processor 715 provides information to transformer 718 such that transformer 718 may perform a first reverse transformation on the encoded data. The information provided to transformer 718 by transform information processor 715 enables transformer 718 to determine an appropriate reverse transformation to perform on the encoded data. Once transformer 718 performs a first reverse transformation on the encoded data, transformer 718 provides the at least partially decoded data to a buffer 710.

If additional transformations are to be performed on the partially decoded data, buffer 710 provides the partially decoded data to transformer 718 and, optionally, to transform information processor 715. When the encoded data that was stored in non-volatile memory 722 is completely decoded, then buffer 710 provides the decoded data to host 706. It should be understood that the symbols which indicate the transformations performed to encode data or the reverse transformations that may serve to decode encoded data are generally removed from the data pattern provided to host 706 by transformer 718.

In general, the steps associated with decoding encoded data may be widely varied. With respect to FIG. 8, one method of decoding encoded data will be described in accordance with an embodiment of the present invention. A process 800 begins at step 804 in which data are obtained from a non-volatile memory, e.g., a non-volatile memory that is a part of an overall memory system. Specifically, encoded data are read from non-volatile memory into a transformer or a buffer, typically when a request for the encoded data are received from a host.

Once data are obtained from non-volatile memory 804, the data are transformed based on transform information in step 808. In the described embodiment, a reverse transformation is performed on the data that was stored in the non-volatile memory. As previously discussed, the reverse transformation that is performed on the data may be determined by reading symbols which were stored with the data stored in the non-volatile memory.

A determination is made in step 812 regarding whether the transformation on the data is complete. That is, it is determined if the data obtained in step 804 has been transformed back to its original format, i.e., the format the data was in prior to being transformed for storage. If it is determined that the transformation on the data is complete, then the indication is that no additional reverse transformations are needed to fully decode the data. In other words, the indication is that the data are already decoded. As such, the decoded data are provided to the host in step 816, and the process of decoding data is completed.

Alternatively, if it is determined in step 812 that the transformation on the data is not completed, the implication is that at least one additional reverse transformation is to be performed on the data before the data are returned to its original format. Therefore, process flow moves from step 812 to step 820 in which the already partially transformed data, i.e., the already partially decoded data, is transformed again, based upon the transform information that was stored with the data. Once the transformation on the partially transformed data is completed, process flow returns to step 812 in which a determination is made as to whether the transformation on the data obtained in step 804 is complete.

As discussed previously, a transformer processes, e.g., encodes, input data to create an output data version of the input data. The transformer may generally process the input data using any suitable transformation, or transformation algorithm. FIG. 9*a* is a diagrammatic representation of a transformer which encodes data in accordance with an embodiment of the present invention. A transformer 918, which may be a representation of transformer 218 of FIG. 2*a* or transformer 318 of FIG. 3*a*, is arranged to accept input 930 from a host. Transformer 918 processes input 930 and generates output 934, which is typically a representation of input 930. In one embodiment, input 930 may be arranged in a first data format which may be considered relatively inefficient to store. When input 930 is in a first format, transformer 918 may process input 930 such that output 934 is effectively a transformed or encoded version of input 930. As mentioned above, output 934, in addition to being an encoded representation of input 930, typically also includes information which indicates a transformation that was used to generate output 934. Such information may be stored in cells or extra symbols, e.g., two cells or two extra symbols, which are effectively appended to the cells in output 934 that contain the transformed version of input 930.

Transformer 918 may generally level, e.g., reduce the density of or increase the density of, substantially any symbol. By way of example, transformer 918 may level the symbol or logic state with the highest density in order to reduce the density of that symbol. In one embodiment, the symbol with the highest density may be leveled using the symbol with the lowest density, i.e., leveling out the symbol with the highest density may be achieved by increasing the density of the symbol which has the lowest density in the unencoded format. Multiple transformations, or leveling processes, may be used to achieve a desired density of each symbol before the transformed output is stored, e.g., in a non-volatile memory. It has been observed that in some systems, leveling a logic state such that no symbol appears more than approximately fifty percent of the time results in a performance speed improvement of approximately five percent.

An example of a leveling algorithm is shown in FIG. 9*b*. Specifically, FIG. 9*b* is a diagrammatic representation of a transformation associated with encoding transformer 918 of FIG. 9*a* in accordance with an embodiment of the present invention. As shown, the symbol in input 930' which is the most dense is labeled as symbol "D," while the symbol in input 930' which is the least dense is labeled as symbol "S." In the described embodiment, the symbol that is the densest and the symbol that is the least dense are two of sixteen symbols which are potentially associated with input 930'. For ease of discussion, primarily only symbols "D" and "S" are shown. It should be appreciated, however, that other symbols may occur substantially anywhere throughout the data stream associated with input 930'. In other words, other symbols may precede, follow, or be interspersed within the data stream associated with input 930'. For purposes of illustration, a single occurrence of each of a symbol "F" and a symbol "G" are shown in the data stream associated with input 930', although symbols "F" and "G" appear in input 930' more often than symbol "S". In the described embodiment, no leveling involving the use of symbols "F" and "G" is performed. Hence, occurrences of symbols "F" and "G" are effectively not transformed by transformer 918'.

While input 930' is an ordered data stream, i.e., is a data stream that is provided to encoding transformer 918' serially, the data stream may also be provided in a non-ordered format. When the data stream is provided in a non-ordered format, processes associated with encoding transformer 918' may be modified to transform the non-ordered data stream.

Input 930' is provided to encoding transformer 918' which is arranged to level symbol "D" using symbol "S." That is, encoding transformer 918' executes a transformation algorithm which reduces the density of symbol "D" through the use of symbol "S." In the described embodiment, encoding transformer 918' allows the first occurrence of either symbol "D" or symbol "S" to remain the same. Specifically, between symbol "D" and symbol "S," whichever symbol occurs first within input 930' is encoded to the same symbol. All subsequent occurrences of symbol "S" are encoded to the same symbol as the most recent previous encoded symbol "D" or "S". For example, if the most recent previous symbol has been encoded as symbol "S," then the current symbol "S" is encoded as symbol "S," and if the most recent previous encoded symbol has been encoded as symbol "D," then the current symbol "S" is encoded as symbol "D." All subsequent cases of input symbol "D" are encoded in the opposite manner as the most recent previous encoded symbol. By way of example, if the most recent previous symbol has been encoded as symbol "S," then the current symbol "D" is encoded as symbol "D," and if the most recent previous symbol has been encoded as symbol "D," then the current symbol "D" is encoded as symbol "S."

As shown, output 934' is a leveled representation of input 930' which includes fewer occurrences of symbol "D." In other words, the density of symbol "D" is reduced in output 934'. It should be appreciated that while the density of symbol "S" is shown as being increased, the density of symbol "S" may be reduced by leveling symbol "S" using another symbol. That is, symbol "S" may be identified as having a higher than desired density in output 934', and may be leveled in performing a second transformation using a different symbol which has a lower density, or a sparse symbol, by providing output 934' as a new input to encoding transformer 918'.

For an embodiment in which there are sixteen states or symbols, there may be up to approximately 240 transformation algorithms which may usefully be used to level out the most dense and the least dense symbols in input 918'. In such an embodiment, a transformation may involve leveling a single pair of symbols, and the least dense symbol associated with input 930' may occur no less than approximately 6.67 percent of the time after the transformation. Transformer 918' may be used to level symbols such that no symbol occurs in the transformed data pattern more than approximately fifty percent of the time. For example, as shown, symbol "D" may be leveled with symbol "S" such that neither symbol "D" nor symbol "S" occurs in output 934' more than approximately fifty percent of the time.

Transformer 918' may also be used to encode data sequentially, e.g., by performing multiple transforms sequentially. When data is encoded sequentially, transformer 918' may level a most dense state or symbol with a least dense state or symbol. Once an encoded set of data 934' is formed, transformer 918' may level the new densest symbol, or the densest symbol in the encoded data, with the new sparsest symbol, or the sparsest symbol in the encoded data. After two sequential leveling processes have occurred in an embodiment with sixteen symbols, no symbol occurs in the completed transformation more than approximately fifty percent of the time. In one embodiment, after two serial leveling processes have occurred, transformer 918' may level the new densest symbol with the new sparsest symbol, i.e., the densest and sparsest symbols in the twice encoded data. As a result of such a third transformation, no symbol occurs in the completed transformation more than approximately twenty-five percent of the time.

Transformer 918' may be arranged to level at least two dense symbols substantially simultaneously, i.e., in parallel. During any pass through transformer 918', transformer 918' may be arranged to level a densest symbol with a sparsest symbol, as well as a second densest symbol with a second sparsest symbol, at the same time. For example, as discussed above, when a most dense symbol is leveled with a least dense symbol, no symbol occurs in the encoded data, or output 934', more than approximately fifty percent of the time. However, when transformer 918' encodes data sequentially such that the densest symbol in the encoded data is leveled with the sparsest symbol in the encoded data while the second densest symbol in the encoded data is leveled with the second sparsest symbol in the encoded data during a second pass through transformer 918', no symbol in the twice encoded data occurs more than approximately twenty-five percent of the time.

Adding additional complexity associated with repetitive transformations performed on a set of data typically results in a further reduction of a maximum symbol density, as shown by the above examples. However, the complexity associated with a process of reducing the maximum density of symbols as described above may affect the overall performance of a storage operation to the extent that the benefits associated with the increased degrees of leveling may effectively be compromised. The complexity may be associated with additional computing time, additional circuitry, or additional power required to complete multiple transformations. Hence, there may be a trade-off between the complexity associated with leveling or transformation processes and storage benefits. In addition, there may be a trade off between the cost of logic, e.g., circuitry, needed to enable parallel or substantially simultaneous transformations to occur and the time required to perform multiple transformations sequentially.

Once data are encoded or leveled, the encoded data generally becomes the input into a decoding transformer when a request is made to retrieve stored, encoded data. FIG. 10a is a diagrammatic representation of a transformer which decodes data in accordance with an embodiment of the present invention. A decoding transformer 1018 accepts an input 1030, which is generally processed, e.g., encoded or leveled, by an encoding transformer such as encoding transformer 918 of FIG. 9a. In one embodiment, decoding transformer 1018 and encoding transformer 918 of FIG. 9a may be part of an overall transformer associated with a non-volatile memory system. Decoding transformer 1018 decodes input 1030 to produce output 1034. Typically, output 1034 is of the same format as the input provided to an encoding transformer, e.g., input 930 of FIG. 9a.

With reference to FIG. 10b, a decoding transformer which is suitable for effectively reversing the encoding performed by encoding transformer 918' of FIG. 9b will be described in accordance with an embodiment of the present invention. Input 1030', which has been encoded by encoding transformer 918' of FIG. 9b, is provided to decoding transformer 1018'. Decoding transformer 1018' is arranged to use information obtained by reading symbols in input 1030', e.g., two symbols interspersed into input 1030', which identify the transformation used to create input 1030' or, alternatively, an appropriate reverse transformation to use to decode input 1030', to create output 1034'.

In the described embodiment, decoding transformer 1018' does not change either the first occurrence of symbol "D" or symbol "S." Decoding transformer 1018' is arranged to decode substantially all occurrences of symbol "S" as symbol "S" if a current occurrence of symbol "S" is more recently preceded by an occurrence of symbol "S" than by an occurrence of symbol "D" in input 1030'. That is, if the more recent previous symbol in input 1030' is symbol "S," the current occurrence of symbol "S" is decoded as symbol "S." Otherwise, the current occurrence of symbol "S" is decoded as symbol "D," unless the current occurrence of symbol "S" is the first occurrence of symbol "S," and occurs before a first occurrence of symbol "D," in which case the current occurrence of symbol "S" is decoded as symbol "S."

Decoding transformer 1018' is also arranged to decode a current occurrence of symbol "D" as symbol "S" if the current occurrence is preceded more recently by symbol "D" than by symbol "S," and to decode a current occurrence of symbol "D" as symbol "D" if the current occurrence is preceded more recently by symbol "S." The first occurrence of symbol "D," if it occurs before any occurrence of symbol "S" in input 1030', is decoded as symbol "D."

While data may be transformed such that the maximum density of a particular symbol or state is minimized, data may also be transformed to effectively ensure that each symbol or state has a minimum density. By way of example, in a binary system in which the symbols are either "1" or "0," data may be transformed using transformer 918' of FIG. 9b such that the percentage of symbol "1" in the transformed data and the percentage of symbol "0" in the transformed data are each greater than a minimum of approximately thirty-three percent.

Although only a few embodiments of the present invention have been described, it should be understood that the present invention may be embodied in many other specific forms without departing from the spirit or the scope of the present invention. By way of example, although processes of encoding and decoding data have generally been described as occurring on a memory device that is in communication with a host system, either or both the encoding and decoding processes may instead occur on the host system. In other words, a host system may be arranged to generate statistics relating to data that is to be stored and to transform the data into a different format based on the statistics before causing the transformed data to be stored on a memory device. Alternatively, a host system may be arranged to read encoded data from a memory device, determine a suitable transformation for decoding the data, then decode the data.

The present invention may generally be implemented with respect to any suitable memory device. Suitable memory devices, as described above, may include, PC cards, CompactFlash cards, MultiMedia cards, and secure digital cards. Other suitable memory devices may include, but are not limited to, Smart Media cards and Memory Stick cards.

In one embodiment, a host may generate statistics for a data pattern before providing the data pattern and the statistics to a memory device. When the host generates statistics, the memory device may transform the data pattern into a preferred format without having to generate any statistics. That is, when the host generates statistics associated with a data pattern, a memory device may simply use those statistics to transform the data pattern.

As described above, multiple transformations may be performed on a given data set or pattern to transform the data set into a suitable format for storage. In one embodiment, after each transformation of the multiple transformations is completed, the transformations, or intermediate transformations, may be studied or processed by a statistics generator to determine if additional transformations may be needed to create an efficiently storable format.

While a transformer which encodes data has been described separately from a transformer which decodes the data, it should be appreciated that a single transformer may generally both encode and decode data. That is, a non-volatile memory system may include a single transformer which has the functionality to both encode and decode data. Similarly, a statistics generator and a transform information processor may be part of a single processor which is arranged both to determine statistics associated with data that is to be transformed and to effectively determine how transformed data has been transformed.

Multiple reverse transformations may be performed on transformed data associated with substantially any non-volatile memory system. In other words, although multiple reverse transformations have been described as being suitable for use in transforming data in a system in which data are read from a non-volatile memory into a transformer and then into a buffer, multiple reverse transformations may also be performed in a system in which transformed data are provided to a buffer prior to being processed by a transformer.

Although the transformation of data to effectively create preferred, or more common, data patterns from less preferred data patterns, or corner cases, has been described as allowing the data to be more efficiently stored, it should be appreciated that data may be transformed to effectively create preferred data patterns for a variety of other purposes. That is, the leveling of symbols which appear within a data set may be performed for substantially any suitable purpose. By way of example, leveling states within a data pattern that is to be transmitted from one site to another site may enable the transmission process to occur more efficiently, and also enable the receiving process to occur more efficiently. Such transmission processes may include wired transmissions within a network, or wireless transmissions within a network.

A transformation has been described above, e.g., with reference to FIG. 9b, as being suitable for use in leveling one state using another state. As discussed above, when more than one state is to be reduced, multiple transformations may be used. It should be appreciated that a single pass through such a transformer may generally be arranged to reduce more than one state. For example, two or more symbol or state pairs may be leveled in a single pass through such a transformer. When more than one state pair is leveled in one pass through a such transformer, fewer overall passes through the transformer may be required to complete a given transformation or leveling on the data.

In general, the steps associated with encoding and decoding data may be widely varied. Steps may be added, removed, altered, and reordered without departing from the spirit or the scope of the present invention. For instance, in an encoding or transformation process, the step of analyzing transformed data may be substantially eliminated for an embodiment in which transforms which are to be used to complete the overall transformation of data are determined when raw or untransformed data are analyzed, as previously discussed. Alternatively, the step of analyzing transformed data may precede a determination of whether an overall transformation has been completed.

The transformation or leveling of states within a data set has been described as being suitable for use in substantially minimizing the maximum density of any one state within the transformed version of the data set, or for use in substantially maximizing the minimum density of any one state within the transformed version of the data set. The leveling of states may also be performed to substantially minimize a maximum density of a particular state while substantially maximizing the minimum density of another state. It should be appreciated that leveling of states may also be performed to effectively ensure that the density of all states in a transformed version of a data set falls in a given range. In other words, states may be leveled such that within a transformed version of a data set, no state has a density which exceeds an upper threshold value and no state has a density which falls below a lower threshold value. While the upper threshold value for different states may be substantially the same, and the lower threshold value for different states may be substantially the same, the threshold values may also differ for different states.

Determining the density of particular states within a data pattern or data set has been described in terms of determining a percentage of the particular states within the data pattern. In one embodiment, e.g., an embodiment in which the length of the data pattern is substantially fixed, determining the density of particular states may involve substantially only counting the occurrences of the particular states. As such, determining the density of particular states may generally involve associating a numerical value such as a count or a percentage, with the occurrences of each state.

While the amount of transformation or leveling performed on a data set may generally be chosen such that states within a transformed version of the data set may meet desired maximum and minimum densities, the amount of transformation or leveling may also be chosen based upon other criteria without departing from the spirit or the scope of the present invention. For example, the amount of leveling may be chosen such that a certain amount of computational overhead is not exceeded. Choosing the amount of leveling such that a certain amount of computational overhead is not exceeded may enable the efficiency at which data are stored to be improved without significantly affecting the performance of the overall system associated with transforming and storing the data. Although an embodiment which specifies that the computational overhead does not exceed a particular level may slightly compromise a transformation process, e.g., a maximum density of a particular state may be slightly higher than preferred, the compromise may be considered to be acceptable if the performance of the overall system remains at a certain level. Therefore, the present examples are to be considered as illustrative and not restrictive, and the invention is not to be limited to the details given herein, but maybe modified within the scope of the appended claims.

What is claimed is:

1. A method for storing information in a memory system, the information being in a first data format, the method comprising:

generating statistics associated with the first data format, the first data format being arranged to include two or more symbols, the statistics being arranged to indicate numbers of occurrences of a first and a second symbol of the two or more symbols;

transforming the information from the first data format to a second data format the transformation providing a smaller difference between the numbers of occurrences of the first and second symbols in the second format than the difference between the numbers of occurrences of the first and second symbols in the first format; and storing the information in the second data format in a memory associated with the memory system, wherein storing the information in the second data format in the memory includes storing an identifier in the memory which indicates a transformation used to transform the information from the first data format to the second data format.

2. The method of claim 1 wherein transforming the information from the first data format to the second data format using the statistics includes:

transforming the information from the first data format to the second data format to reduce the density of the first symbol within the information.

3. The method of claim 1 wherein transforming the information from the first data format to the second data format using the statistics includes:

transforming the information from the first data format to the second data format to increase the density of the first symbol within the information.

4. The method of claim 1 wherein receiving the information in the first data format, on the memory system includes:

receiving the information from a host system, the host system being in communication with the memory system.

5. The method of claim 1 wherein at least one cost associated with storing the information in the second data format is less than or equal to at least one cost associated with storing the information in the first data format.

6. The method of claim 1 wherein power used by the memory system for storing the information in the second data format is less than or equal to power used by the memory system for storing the information in the first data format.

7. The method of claim 1 wherein the first data format includes sixteen symbols.

8. The method of claim 1 wherein transforming the information from the first data format to the second data format using the statistics includes:

transforming the information from the first data format to the second data format to reduce the density of the first symbol within the information and to increase the density of the second symbol, wherein the density of the first symbol is a highest density associated with the first data format and the density of the second symbol is the lowest density associated with the first data format.

9. A method for retrieving information in a memory system, the information being stored in a first data format in a memory of the memory system, the method comprising:

analyzing the information in the first data format, the first data format including two or more symbols, including a first symbol and a second symbol, wherein analyzing the information in the first data format includes determining at least one appropriate transformation for use in transforming the information from the first data format into a second data format; and transforming the information from the first data format into the second data format, the second data format having a greater difference between numbers of occurrences of the first and second symbols than the first format has.

10. The method of claim 9 wherein the second data format was initially transformed using statistics associated with two or more symbols of the second data format.

11. The method of claim 9 wherein analyzing the information in the first data format includes:

reading a section of the information in the first data format, wherein the section includes symbols which identify the appropriate transformation.

12. The method of claim 9 wherein the memory system is in communication with a host system, the method further including:

providing the transformed information in the second data format to the host system.

13. The method of claim 9 wherein at least one cost associated with storing the information in the first data format in the memory is not greater than at least one cost associated with storing the information in the second data format in the memory.

14. The method of claim 9 wherein power used by the memory system for storing the information in the first data format in memory is not greater than power used by the memory system for storing the information in the first data format in the memory.

15. A memory device comprising:
a memory;
an input receiver, the input receiver being arranged to receive information, the information being arranged in a first data format, the first data format including two or more symbols;
a statistics generator, the statistics generator being arranged to generate statistics associated with the two or more symbols of the first data format; and
a transformer, the transformer using the statistics to transform the information from the first data format into a second data format, the transformer storing the information in the second data format in the memory, the first and second data formats including numbers of a first and a second symbol, the first format having a greater difference between the number of the first and second symbols than the second format has.

16. The memory device of claim 15 wherein costs associated with storing the information in the second data format are less than or equal to costs associated with storing the information in the first data format.

17. The memory device of claim 15 wherein the statistics generator is further arranged to determine a density of a first symbol in the first data format by determining a numerical value associated with occurrences of the first symbol in the first data format, the numerical value being indicative of the density.

18. The memory device of claim 17 wherein the transformer is further arranged to transform the information from the first data format to the second data format to reduce the density of the first symbol within the information.

19. The memory device of claim 17 wherein the transformer is further arranged to transform the information from the first data format to the second data format to increase the density of the first symbol within the information.

20. The memory device of claim 17 wherein the transformer is further arranged to store an identifier with the information in the second data format, the identifier being arranged to substantially identify at least one transformation used to transform the information from the first data format into the second data format.

21. The memory device of claim 20 further including an information processor, the information processor being arranged to read the identifier, the information processor further being arranged to cooperate with the transformer such that the transformer identifies at least one appropriate transformation to transform the information from the second data format to the first data format.

22. The memory device of claim 21 wherein the input receiver is arranged to interface with a host system and the transformer is further arranged to provide the information in the first data format to the host system after the transformer transforms the information from the second data format to the first data format.

23. The memory device of claim 15 wherein the input receiver is arranged to interface with a host system to receive the information in the first data format from the host system.

24. The memory device of claim 15 wherein the memory system is a non-volatile memory system that interfaces with a host system.

25. The memory device of claim 24 wherein the non-volatile memory system is removable from the host system.

26. The memory device of claim 24 wherein the memory is a non-volatile storage element.

27. The memory device of claim 24 wherein the memory device is a card selected from the group consisting of a PC card, a CompactFlash card, a MultiMedia card, a secure digital card, a Memory Stick card, and a Smart Media card.

28. The memory device of claim 24 wherein the memory device is a single chip device.

29. A method for transforming data from a first format into a second format, the method comprising:
determining a first density of a first symbol, the first density being associated with the first format;
determining a second density of a second symbol, the second density being associated with the first format, wherein the first density is greater than the second density, the first density being above an upper threshold value, the second density being below a lower threshold value; and
leveling the first symbol with the second symbol, wherein leveling the first symbol with the second symbol includes creating a third density of the first symbol, the third density being associated with the second format, and creating a fourth density of the second symbol, the fourth density being associated with the second format, wherein the third density is less than the first density and both the third density and the fourth density are below the upper threshold value and above the lower threshold value.

30. The method as recited in claim 29 wherein the fourth density is greater than the second density.

31. The method as recited in claim 29 wherein the second format includes an indicator, the indicator being arranged to indicate that the first symbol has been leveled with the second symbol.

32. A method of storing data in a memory cell array, an individual memory cell having two or more possible states representing one or more bits of data, comprising:
receiving data for storage in the memory array, the received data in a first format, storage of the data in the first format requiring cells to be programmed to a first possible state and a second possible state;
transforming the data to a second format by replacing some, but not all, data portions corresponding to the first possible state by data portions corresponding to the second possible state; and
subsequently writing the data to the memory cell array.

33. The method of claim 32 wherein the transformation is according to an algorithm applied sequentially to portions of the data, the algorithm replacing a data portion corresponding to the first possible state by a data portion corresponding to the second possible state if the previous data portion transformed to a second format corresponds to a first possible state.

34. The method of claim 32 wherein the algorithm replaces a data portion corresponding to the second possible state with a data portion corresponding to the first possible state if the previous data portion transformed to a second format corresponds to a first possible state.

35. The method of claim 32 wherein the memory cell array is incorporated in a removable memory card having an interface complying with one of the standards: PC card, CompactFlash card, MultiMedia Card, Secure Digital card, Memory Stick card or Smart Media card.

36. The method of claim 32 further comprising analyzing the data in a first format to determine which data portions, if any, should be transformed and which transformation should be applied.

37. The method of claim 36 wherein the analysis is carried out by a host system that communicates with the memory cell array, the host system sending information derived from the analysis to the memory array.

38. The method of claim 32 further comprising transforming the data from the second format to a third format prior to storing the data in the memory cell array, the data stored in the third format.

39. The method of claim 32 further comprising storing a portion of data indicating the transformation or transformations performed on the data at a location remote from a location where the data is stored.

* * * * *